(12) United States Patent
Hong et al.

(10) Patent No.: US 10,297,336 B2
(45) Date of Patent: May 21, 2019

(54) FAIL BIT COUNTER AND SEMICONDUCTOR MEMORY DEVICE HAVING THE SAME

(71) Applicant: SK hynix Inc., Gyeonggi-do (KR)

(72) Inventors: Yong Hwan Hong, Gyeonggi-do (KR); Byung Ryul Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 2 days.

(21) Appl. No.: 15/632,606

(22) Filed: Jun. 26, 2017

(65) Prior Publication Data

US 2018/0144813 A1    May 24, 2018

(30) Foreign Application Priority Data

Nov. 21, 2016  (KR) .................. 10-2016-0155188

(51) Int. Cl.
| | |
|---|---|
| *G11C 29/44* | (2006.01) |
| *G11C 16/04* | (2006.01) |
| *G11C 16/34* | (2006.01) |
| *G11C 29/26* | (2006.01) |
| *G11C 29/56* | (2006.01) |
| *G11C 29/52* | (2006.01) |
| G11C 29/12 | (2006.01) |
| G11C 29/04 | (2006.01) |

(52) U.S. Cl.
CPC .............. *G11C 29/44* (2013.01); *G11C 16/04* (2013.01); *G11C 16/349* (2013.01); *G11C 29/26* (2013.01); *G11C 29/52* (2013.01); *G11C 29/56* (2013.01); G11C 2029/0409 (2013.01); G11C 2029/1204 (2013.01)

(58) Field of Classification Search
CPC ....... G11C 29/44; G11C 16/04; G11C 16/349; G11C 29/26; G11C 29/52; G11C 29/56; G11C 2029/0409; G11C 2029/1204
USPC .................................. 714/704, 718, 723, 201
See application file for complete search history.

(56) References Cited

U.S. PATENT DOCUMENTS

| | | | | |
|---|---|---|---|---|
| 8,228,740 | B2* | 7/2012 | Joo ..................... | G06F 11/1048 365/185.14 |
| 8,595,593 | B2* | 11/2013 | Joo ..................... | G06F 11/1048 714/6.24 |
| 8,625,355 | B2* | 1/2014 | Chokan .............. | G11C 16/3459 365/185.22 |
| 2003/0088815 | A1* | 5/2003 | Boehler ................ | G11C 29/38 714/710 |
| 2010/0315880 | A1* | 12/2010 | Joo ..................... | G06F 11/1048 365/185.22 |
| 2010/0329030 | A1* | 12/2010 | You ....................... | G11C 16/10 365/185.22 |
| 2012/0155186 | A1* | 6/2012 | Chokan .............. | G11C 16/3459 365/185.22 |

(Continued)

FOREIGN PATENT DOCUMENTS

| | | |
|---|---|---|
| KR | 1020060043194 | 5/2006 |
| KR | 1020120136116 | 12/2012 |

*Primary Examiner* — John J Tabone, Jr.
(74) *Attorney, Agent, or Firm* — IP & T Group LLP

(57) ABSTRACT

Provided herein is a fail bit counter. The fail bit counter includes a pass/fail data receiver receiving pass/fail data indicating whether memory cells coupled to a bit line sequentially pass or fail, and a fail bit accumulator receiving a fail bit generation signal from the pass/fail data receiver, and accumulating and counting fail bits which are generated.

10 Claims, 7 Drawing Sheets

(56) References Cited

U.S. PATENT DOCUMENTS

| | | | | |
|---|---|---|---|---|
| 2012/0314500 | A1* | 12/2012 | Song | G11C 16/3459 |
| | | | | 365/185.12 |
| 2013/0148435 | A1* | 6/2013 | Matsunaga | G11C 16/3404 |
| | | | | 365/185.23 |
| 2013/0336057 | A1* | 12/2013 | Chung | G11C 16/10 |
| | | | | 365/185.03 |
| 2014/0063944 | A1* | 3/2014 | Lee | G11C 16/3404 |
| | | | | 365/185.09 |
| 2014/0063949 | A1* | 3/2014 | Tokiwa | G11C 16/16 |
| | | | | 365/185.11 |
| 2014/0258794 | A1* | 9/2014 | Yang | G11C 16/26 |
| | | | | 714/704 |
| 2016/0077153 | A1* | 3/2016 | Lu | G11C 29/42 |
| | | | | 714/719 |
| 2017/0046210 | A1* | 2/2017 | Yim | G06F 11/076 |
| 2017/0162270 | A1* | 6/2017 | Park | G11C 16/10 |
| 2017/0206124 | A1* | 7/2017 | Lim | G06F 11/0727 |

* cited by examiner

FAIL BIT COUNTER AND
SEMICONDUCTOR MEMORY DEVICE
HAVING THE SAME

CROSS-REFERENCE TO RELATED APPLICATION

The present application claims priority under 35 U.S.C. § 119(a) to Korean patent application number 10-2016-0155188 filed on Nov. 21, 2016, which is herein incorporated by reference in its entirety.

BACKGROUND

Field of Invention

Various embodiments of present invention generally relate to an electronic device, and more particularly, to a fail bit counter and a semiconductor memory device having the same.

Description of Related Art

Semiconductor memory devices are integrated circuits embodied on a semiconductor such as silicon (Si), germanium (Ge), gallium arsenide (GaAs), indium phosphide (InP), and the like. The semiconductor memory devices may be volatile memory devices or nonvolatile memory devices.

In a volatile memory device, data stored in the volatile memory device is lost when a power supply is interrupted. Examples of a volatile memory device include a static RAM (SRAM), a dynamic RAM (DRAM), a synchronous DRAM (SDRAM), and the like. A nonvolatile memory device retains the stored data even when the power supply interrupted. Examples of a nonvolatile memory device include a read only memory (ROM), a programmable ROM (PROM), an electrically programmable ROM (EPROM), an electrically erasable and programmable ROM (EEPROM), a flash memory, a phase-change RAM (PRAM), a magnetic RAM (MRAM), a resistive RAM (RRAM), a ferroelectric RAM (FRAM), and the like. A flash memory may be a NAND type, a NOR type, or a hybrid NAND-NOR type.

SUMMARY

According to one aspect of the present invention, there is provided a fail bit counter that can count the fail bits of a memory device. The memory device may be a volatile memory device or a non-volatile memory device. The fail bit counter may count the fail bots of a memory device cumulatively.

Another aspect of the present invention is directed to a semiconductor memory device including the fail bit counter.

One embodiment of the present invention provides a fail bit counter comprising a pass/fail data receiver and a fail bit accumulator. The pass/fail data receiver is suitable for receiving pass/fail data sequentially and generating a fail bit generation signal based on the pass/fail data. The pass/fail data indicates whether memory cells coupled to at least one bit line are passed or failed. The fail bit accumulator is suitable for receiving the fail bit generation signal from the pass/fail data receiver, and cumulatively counting fail bits based on the fail bit generation signal.

According to an embodiment, the pass/fail data receiver may include a receiving flip-flop, which is initialized by a reset signal and receives the pass/fail data as an input based on a read signal.

The receiving flip-flop may output the pass/fail data as the fail bit generation signal in response to the read signal.

The fail bit accumulator may include a first accumulator outputting a first fail bit activation signal activated when one or more fail bits are generated based on the fail bit generation signal.

The first accumulator may comprise a first multiplexer receiving the fail bit generation signal as a first input, and a first accumulating flip-flop initialized by an initialization signal and receiving an output of the first multiplexer based on a first transmission signal. An output of the first accumulating flip-flop may be fed back as a second input of the first multiplexer, and the first multiplexer may output one of the first input and the second input based on the fail bit generation signal.

The fail bit accumulator may comprise a first accumulator to an Nth accumulator, and an ith accumulator of the first to Nth accumulators outputs an ith fail bit activation signal activated when i or more fail bits are generated based on the fail bit generation signal, where N is a natural number greater than or equal to 1 and i is a natural number greater than or equal to 1 and smaller than or equal to N.

The ith accumulator may be coupled to an (i−1)th accumulator and receives an (i−1)th fail bit activation signal output from the (i−1)th accumulator based on the fail bit generation signal.

The ith accumulator may output the (i−1)th fail bit activation signal received from the (i−1)th accumulator as the ith fail bit activation signal.

The ith accumulator may include an ith multiplexer and an ith accumulating flip-flop. The ith multiplexer may receive the (i−1)th fail bit activation signal as a the first input, and the multiplexer of the first accumulator may receive the fail bit generation signal as the first input. The ith accumulating D flip-flop may be initialized by an initialization signal and receiving an output of the ith multiplexer based on an ith transmission signal. An output of the ith accumulating flip-flop may be fed back as a second input of the ith multiplexer, and the ith multiplexer may output one of the first input and the second input based on the fail bit generation signal.

The pass/fail data receivers may include a receiving latch temporarily storing the pass/fail data, a receiving set transistor coupled between a first terminal of the receiving latch and a common transmission node, a receiving reset transistor coupled between a second terminal of the receiving latch and the common transmission node, a receiving transistor including a gate coupled to the first terminal of the receiving latch, and a masking transistor coupled between the receiving transistor and an SO node.

The fail bit accumulator may include a first accumulator coupled between the SO node and the common transmission node, and the pass/fail data may be transmitted to the second terminal of the receiving latch.

The first accumulator may include a first accumulating latch, a first set transistor coupled between a first terminal of a first accumulating latch and the common transmission node, a first reset transistor coupled between a second terminal of the first accumulating latch and the common transmission node, and a first transmitting transistor coupled between the second terminal of the first accumulating latch and the SO node.

The fail bit accumulator may include a plurality of accumulators coupled between the SO node and the common transmission node. The pass/fail data may be transmitted to the second terminal of the receiving latch.

Each of the accumulators may comprise an accumulating latch, a set transistor coupled between a first terminal of the accumulating latch and the common transmission node, a reset transistor coupled between a second terminal of the accumulating latch and the common transmission node, and a transmitting transistor coupled between the second terminal of the accumulating latch and the SO node.

Another embodiment of the present invention provides a semiconductor memory device comprising a memory cell array including a plurality of memory cells, a page buffer coupled to the memory cell array through bit lines, and a fail bit counter receiving pass/fail data sequentially indicating whether the plurality of memory cells coupled to the bit lines are passed or failed from the page buffer, and cumulatively counting fail bits based on the pass/fail data.

According to an embodiment, the fail bit counter may include a pass fail data receiver including a receiving flip-flop initialized by a reset signal, and receiving the pass/fail data to output a fail bit generation signal based on a read signal, and a fail bit accumulator outputting a plurality of fail bit activation signals based on the fail bit generation signal.

The fail bit accumulator may include a first accumulator to an Nth accumulator. An ith accumulator, among the first to Nth accumulators, may output an ith fail bit activation signal activated when i or more fail bits are generated based on the fail bit generation signal. N is a natural number greater than or equal to 1, and i is a natural number greater than or equal to 1 and smaller than or equal to N.

The ith accumulator may include an ith multiplexer, and an ith accumulating flip-flop. The ith multiplexer may receive the (i−1)th fail bit activation signal as a first input. The multiplexer of the first accumulator may receive the fail bit generation signal as the first input. The ith accumulating flip-flop may be initialized by an initialization signal and may receive an output of the ith multiplexer based on an ith transmission signal. An output of the ith accumulating flip-flop may be fed back as a second input of the ith multiplexer. The ith multiplexer may output one of the first input and the second input based on the fail bit generation signal.

BRIEF DESCRIPTION OF THE DRAWINGS

The above and other features and advantages of the present invention will become more apparent to those skilled in the art to which the present invention pertains by the following detailed description with reference to the attached drawings in which.

DETAILED DESCRIPTION

Figure 1:
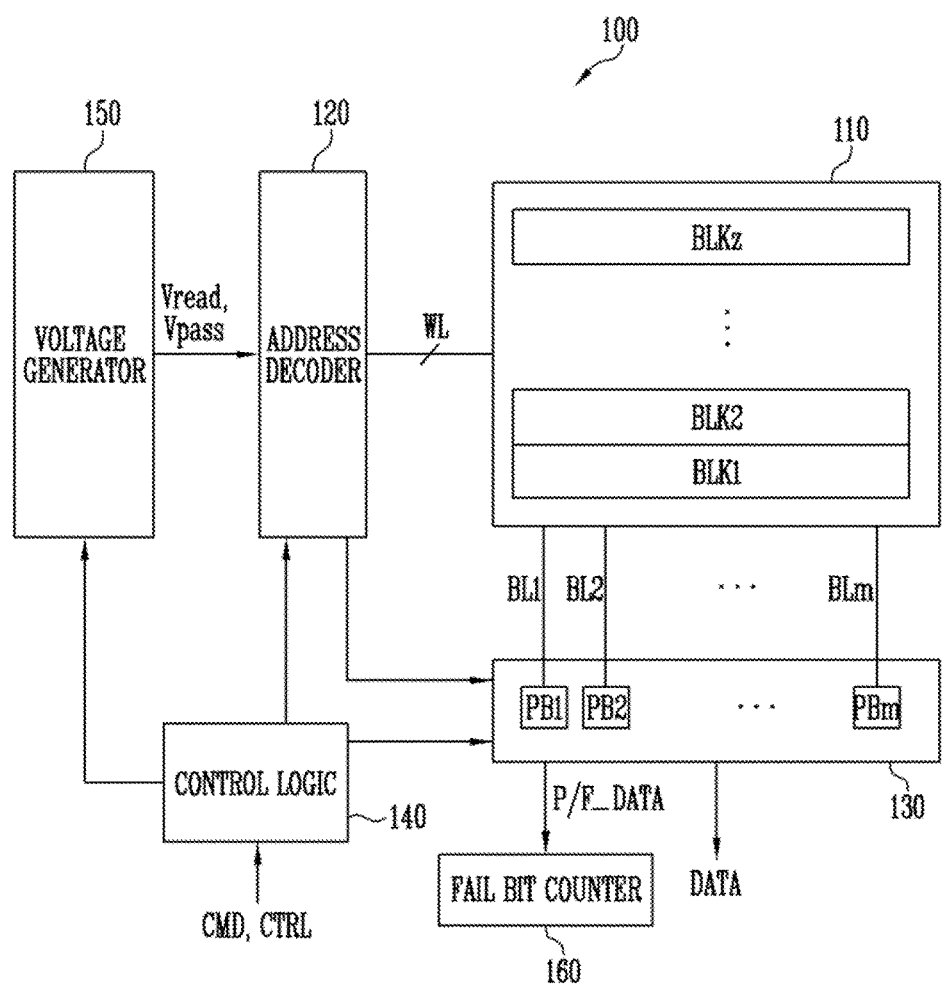
FIG. 1 is a block diagram illustrating a semiconductor memory device according to an embodiment of the present invention.

Various advantages and features of the present invention, and how to accomplish the present invention, will be described through the embodiments described in detail below with reference to the accompanying drawings. However, it is noted that the present invention is not limited to the embodiments described herein, but may be embodied in other forms. However, these embodiments are provided so that this invention will be thorough and complete, and will fully convey the scope of the example embodiments to those skilled in the art.

Throughout the specification, when an element is referred to as being "coupled" to another element, it is understood that it refers both to the case where it is "directly connected", and also to the case where it is "indirectly connected" to the other element. Throughout the specification, when an element is referred to as "comprising" or "including" another element or elements, it should be understood as an open ended limitation meaning that the element may also include more elements other than the stated element or elements.

Hereinafter, exemplary embodiments of the present invention will be described in detail with reference to the accompanying drawings. It should be noted that like reference numerals in the drawings denote like elements even though shown on the other drawings.

It is further noted that in the following description, specific details are set forth for facilitating the understanding of the present invention, however, the present invention may be practiced without some of these specific details. Also, it is noted, that well-known structures and/or processes may have only been described briefly or not described at all to avoid obscuring the present disclosure with unnecessary well known details.

It is also noted, that in some instances, as would be apparent to those skilled in the relevant art, an element described in connection with one embodiment may be used singly or in combination with other elements of another embodiment, unless specifically indicated otherwise.

FIG. 1 is a block diagram illustrating a semiconductor memory device 100 according to an embodiment of the present invention.

Referring to FIG. 1, the semiconductor memory device 100 may include a memory cell array 110, an address decoder 120, a read and write circuit 130, a control logic 140, and a voltage generator 150.

The memory cell array 110 may include a plurality of memory blocks BLK1 to BLKz. The plurality of memory blocks BLK1 to BLKz may be coupled to the address decoder 120 via a plurality of word lines WL. The plurality of memory blocks BLK1 to BLKz may be coupled to the read and write circuit 130 via bit lines BL1 to BLm. Each of the plurality of memory blocks BLK1 to BLKz may include a plurality of memory cells. In an embodiment, the plurality of memory cells may include nonvolatile memory cells having a vertical channel structure.The memory cell array 110 may be a memory cell array having a two-dimensional structure. According to an embodiment, the memory cell array 110 may be a memory cell array having a three-dimensional structure. According to an embodiment of the present invention, each of the plurality of memory blocks BLK1 to BLKz included in the memory cell array 110 may include a plurality of sub-blocks. For example, each of the plurality of memory blocks BLK1 to BLKz may include two sub-blocks. In another embodiment, each of the plurality of memory blocks BLK1 to BLKz may include four sub-blocks. In accordance with a semiconductor memory device and an operation method thereof according to an embodiment of the present invention, the sub-blocks included in the memory blocks BLK1 to BLKz are not limited thereto, but various numbers of sub-blocks may be included in each of the memory blocks BLK1 to BLKz. The plurality of memory cells included in the memory cell array 110 may store data of at least one bit. In one embodiment, each of the plurality of memory cells included in the memory cell array 110 may be a single-level cell (SLC) storing data of one bit. In another embodiment, each of the plurality of memory cells included in the memory cell array 110 may be a multi-level cell (MLC) storing data of two bits. In another embodiment, each of the plurality of memory cells included in the memory cell array 110 may be a triple-level MLC storing data of three bits. In another embodiment, each of the plurality of memory cells included in the memory cell array 110 may be a quad-level MLC storing data of four bits. According to an embodiment, the memory cell array 110 may include a plurality of MLCs each storing data of five or more bits.

The address decoder 120, the read and write circuit 130, the control logic 140, and the voltage generator 150 may operate as peripheral circuits for driving the memory cell array 110. The address decoder 120 may be coupled to the memory cell array 110 via the word lines WL. The address decoder 120 may be configured to operate in response to control of the control logic 140. The address decoder 120 may receive an address through an input/output buffer (not shown) in the semiconductor memory device 100.

The address decoder 120 may be configured to decode a block address, among the received addresses. The address decoder 120 may select at least one memory block according to a decoded block address. The address decoder 120 may decode a row address, among the received addresses. The address decoder 120 may select at least one word line according to a decoded row address. In addition, the address decoder 120 may apply a read voltage Vread generated by the voltage generator 150 to the selected word line of the selected memory block during a read voltage applying operation of a read operation, and apply a pass voltage Vpass to the remaining unselected word lines. In addition, during a program verify operation, a verify voltage generated by the voltage generator 150 may be applied to the selected word line of the selected memory block, and the pass voltage Vpass may be applied to the remaining unselected word lines.

The address decoder 120 may be configured to decode a column address, among the received addresses. The address decoder 120 may transmit a decoded column address to the read and write circuit 130 for selecting a column of the cell array 110, for example, during a program operation.

The read operation and a program operation of the semiconductor memory device 100 may be performed in a page unit. Addresses received at the time of requesting the read operation and the program operation may include a block address, a row address, and a column address. The address decoder 120 may select one memory block and one word line in accordance with the block address and the row address. The column address may be decoded by the address decoder 120 and provided to the read and write circuit 130 for selecting a column.

The address decoder 120 may include a block decoder, a row decoder, a column decoder, an address buffer, and the like.

The read and write circuit 130 may include a plurality of page buffers PB1 to PBm. The read and write circuit 130 may operate as a read circuit during the read operation of the memory cell array 110 and operate as a write circuit during a write operation. The plurality of page buffers PB1 to PBm may be coupled to the memory cell array 110 through the respective bit lines BL1 to BLm. The plurality of page buffers PB1 to PBm may continuously supply sensing currents to the bit lines BL1 to BLm coupled to the memory cells for sensing threshold voltages of the memory cells during the read operation and the program verify operation, and detect a change in the amount of current at a sensing node to latch sensing data at the sensing node. The read and write circuit 130 may operate in response to page buffer control signals output from the control logic 140.

During a read operation, the read and write circuit 130 may sense the data of the memory cell, temporarily store read data, and output data DATA to the input/output buffer (not shown) of the semiconductor memory device 100. In an exemplary embodiment, the read and write circuit 130 may include a column selection circuit, etc., in addition to the page buffers (or page resistors).

The control logic 140 may be coupled to the address decoder 120, the read and write circuit 130, and the voltage generator 150. The control logic 140 may receive a command CMD and a control signal CTRL through an input/output buffer (not shown) of the semiconductor memory device 100. The control logic 140 may be configured to control all operations of the semiconductor memory device 100 in response to the control signal CTRL. The control logic 140 may output a control signal for adjusting a precharge potential level of the sensing node of the plurality of page buffers PB1 to PBm. The control logic 140 may control the read and write circuit 130 to perform the read operation of the memory cell array 110.

The voltage generator 150 may generate a read voltage Vread and a pass voltage Vpass during a read operation in response to a voltage generator control signal output from the control logic 140.

A fail bit counter 160 may be coupled to at least one of the page buffers PB1 to PBm of the read and write circuit 130. In FIG. 1, the fail bit counter 160 is shown as being separate from the read and wile circuit 130 but according to an embodiment the fail bit counter 160 may be included in the read and write circuit 130. In addition, according to an embodiment, the fail bit counter 160 may be included in at least one of the page buffers PB1 to PBm. The fail bit counter 160 may receive pass/fail data P/F_DATA indicating whether the memory cells coupled to at least one of the bit lines BL1 to BLm sequentially pass or fail from the page buffer. The fail bit counter 160 may cumulatively count fail bits generated based on the pass/fail data P/F_DATA. Specifically, the fail bit counter 160 according to the present invention may accumulate failures of data read in a bit line direction, and detect a state in which the number of fail bits of a predetermined column, i.e., the bit line, is equal to or greater than a predetermined number. Thus, a pass/fail check may be performed in the semiconductor memory device 100 without any additional equipment, thereby reducing the cost of a pass/fail check.

Figure 2:
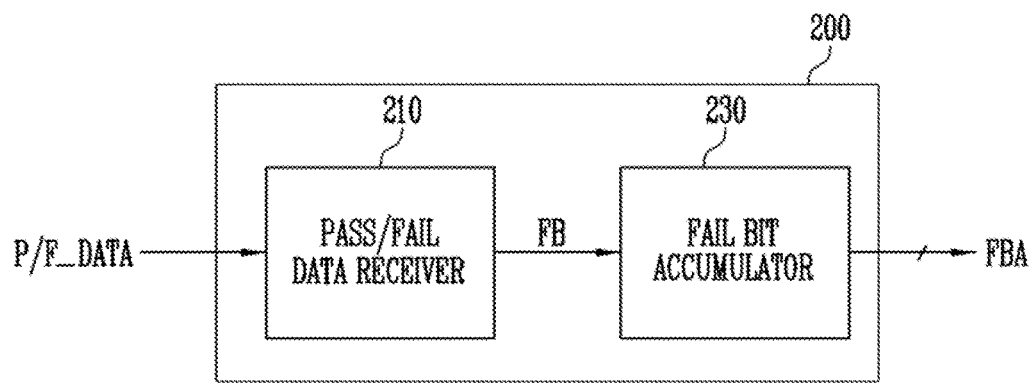
FIG. 2 is a block diagram illustrating a fail bit counter according to an embodiment of the present invention.

FIG. 2 is a block diagram illustrating a fail bit counter 200 according to an embodiment of the present invention.

Referring to FIG, 2 the fail bit counter 200 according to an embodiment of the present invention may include a pass/fail data receiver 210 and a fail bit accumulator 230. The pass/fail data receiver 210 may receive the pass/fail data P/F_DATA sequentially indicating whether the memory cells coupled to at least one of the bit lines BL1 to BLm pass or fail. The fail data receiver 210 may generate a fail bit generation signal FB based on the pass/fail data P/F_DATA. The fail bit accumulator 230 may receive the fail bit generation signal FB from the pass/fail data receiver 210 and cumulatively count the generated fail bits. The counting result may be output as a fail bit count signal FBA. An exemplary embodiment of the fail bit counter shown in FIG. 2 will be described below with reference to FIGS. 4 and 5.

Figure 3:
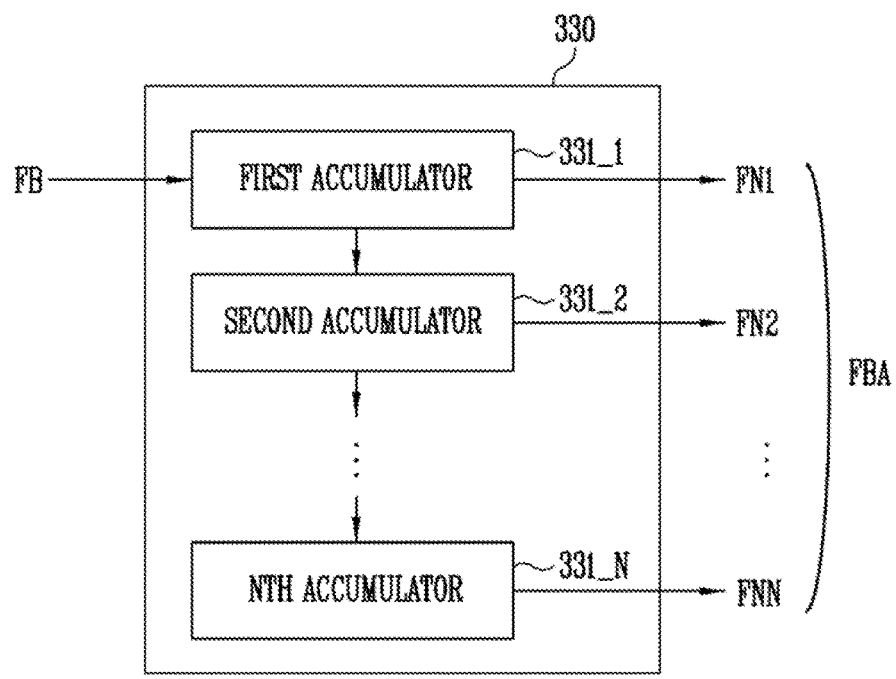
FIG. 3 is a block diagram showing an exemplary configuration of a fail bit accumulator the fail bit counter of FIG. 2.

FIG. 3 is a block diagram showing an exemplary embodiment of the fail bit accumulator of FIG. 2.

Referring to FIG. 3, a fail bit accumulator 330 may include first to Nth accumulators 331_1, 331_2, ..., and 331_N, where N is a natural number greater than or equal to 1. Therefore, according to an embodiment, the fail bit accumulator 330 may include the first accumulator 331_1 or a plurality of accumulators.

The first accumulator 331_1 may output a first fail bit activation signal FN1 which is activated when one or more fail bits are generated based on the fail bit generation signal FB. That is, the first accumulator 331_1 may be inactivated when the number of fail bits is less than 1 i.e., the number of fail bits is 0, and activated when the number of fail bits is equal to or greater than 1.

The second accumulator 331_2 may output a second fail bit activation signal FN2 that is activated when two or more fail bits are generated based on the fail bit generation signal FB. That is, the second fail bit activation signal FN2 may be inactivated when the number of fail bits is less than 2, and activated when the number of fail bits is equal to or greater than 2.

In such a manner, the Nth accumulator 331_N may output an Nth fail bit activation signal FNN which is activated when N or more fail bits are generated based on the fail bit generation signal FB. That is, the Nth fail bit activation signal FNN may be inactivated when the number of fail bits is less than N, and activated when the number of fail bits is equal to or greater than N.

The first to Nth fail bit activation signals FN1 to FNN may be output as the fail bit count signal FBA shown in FIG. 2.

As described with reference to FIGS. 2 and 3, the fail bit counter 200 according to an embodiment of the present invention may count the accumulated fail bits according to the number of accumulators included in the fail bit accumulator 230.

For example, when the number of accumulators is 1 the fail bit counter according to an embodiment of the present invention may count the fail bits to find out whether the number of fail bits is 0, or equal to or greater than 1. In the case where the number of accumulators is 2, the fail bit counter according to an embodiment of the present invention may count the fail bits to find out whether the number of fail bits is 0, 1, or equal to or greater than 2. In the case where the number of accumulators is 3, the fail bit counter according to an embodiment of the present invention may count the fail bits to find out whether the number of fail bits is 0, 1, 2, or equal to or greater than 3. In such a manner, when the number of accumulators is N, the fail bit counter according to an embodiment of the present invention may count the fail bits to find out whether the number of fail bits is 0, 1, 2, ..., N-1, or equal to or greater than N.

The second accumulator 331_2 may be coupled to the first accumulator 331_1. Although not shown in detail in FIG. 3, the second accumulator 331_2 may receive the first fail bit activation signal FN1 output from the first accumulator 331_1 based on the fail bit generation signal FB. In addition, the second accumulator 331_2 may output the received first fail bit activation signal FN1 as the second fail bit activation signal FN2.

Similarly to the second accumulator 331_2, an ith accumulator may be coupled to an (i−1)th accumulator, i being a natural number greater than 2 and smaller than or equal to N. In addition, the ith accumulator may receive an (i−1)th fail bit activation signal output from the (i−1)th accumulator based on the fail bit generation signal FB. In addition, the ith accumulator may output the (i−1)th fail bit activation signal as an ith fail bit activation signal.

An exemplary embodiment of the fail bit accumulator 330 will be described below with reference to FIG. 4.

Figure 4:
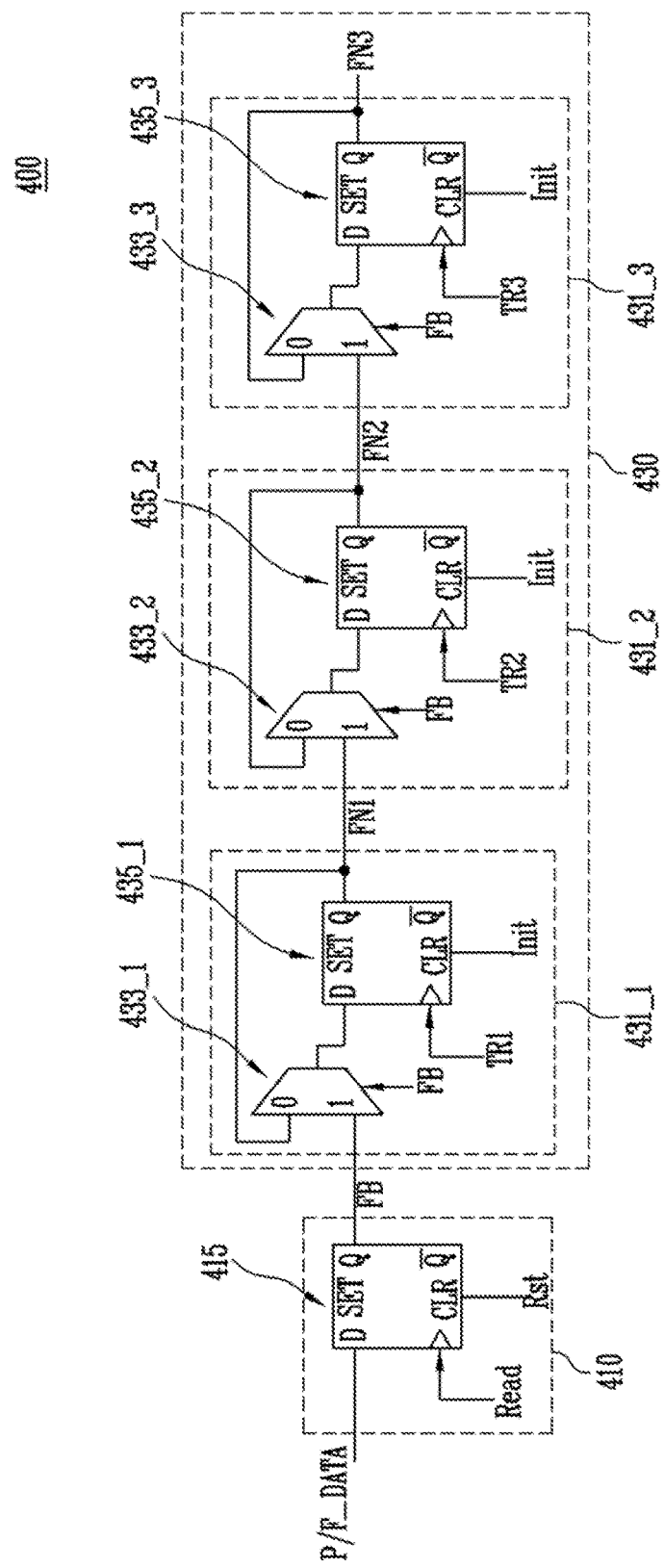
FIG. 4 is a detailed exemplary circuit diagram of the fail bit counter of FIG. 2.

FIG. 4 is an exemplary circuit diagram showing an exemplary embodiment of the fail bit counter of FIG. 2.

Referring to FIG. 4, a fail bit counter 400 may include a pass/fail data receiver 410 and a fail bit accumulator 430.

The pass/fail data receiver 410 may include a receiving flip flop 415. The receiving flip-flop 415 may be implemented with a D flip-flop. The receiving flip-flop 415 may be initialized by a reset signal Rst and receive the pass/fail data P/F_DATA as an input based, on a read signal Read. The receiving flip-flop 415 may output the pass/fail data P/F_DATA as the fail bit generation signal FB in response to the read signal Read.

The fail bit accumulator 430 may include a first accumulator 431_1, a second accumulator 431_2, and a third accumulator 431_3. That is, the fail bit accumulator 430 may include three accumulators. Accordingly, as described above, the fail bit counter 400 shown in FIG. 4 may count the fail bits to find out whether the number of fail bits is 0, 1, 2, or equal to or greater than 3.

The first accumulator 431_1 may include a first multiplexer 433_1 and a first accumulating D flip-flop 435_1. The first multiplexer 433_1 may be coupled to an output terminal of the receiving flip-flop 415 to receive the fail bit generation signal FB as a first input. An output terminal of the first multiplexer 433_1 may be coupled to an input terminal of the first accumulating D flip-flop 435_1. In addition, an output of the first accumulating D flip-flop 435_1 may be fed back as a second input of the first multiplexer 433_1. The first accumulating D flip-flop 435_1 may be initialized by an initialization signal Init and receive an output of the first multiplexer 433_1 based on a first transmission signal TR1. Based on the fail bit generation signal FB, the first multiplexer 433_1 may select and output one of the fail bit generation signal FB received as the first input and the first fail bit activation signal FN1 fed back as the second input. The first accumulating D flip-flop 435_1 may output the output of the first multiplexer 433_1 as the first fail bit activation signal FN1 in response to the first transmission signal TR1.

The second accumulator 431_2 may include a second multiplexer 433_2 and a second accumulating D flip-flop 435_2. The second multiplexer 433_2 may be coupled to an output terminal of the first accumulating D flip-flop 435_1 to receive the first fail bit activation signal FN1 as a first input. An output terminal of the second multiplexer 433_2 may be coupled to an input terminal of the second accumulating D flip-flop 435_2. In addition, an output of the second accumulating D flip-flop 435_2 may be fed back as a second input of the second multiplexer 433_2. The second accumulating D flip-flop 435_2 may be initialized by the initialization signal Init and receive an output of the second multiplexer 433_2 based on a second transmission signal TR2. In addition, based on the fail bit generation signal FB, the second multiplexer 433_2 may select and output one of the first fail bit activation signal FN1 received as the first input and the second fail bit activation signal FN2 fed back as the second input The second accumulating D flip-flop 435_2 may output the output of the second multiplexer 433_2 as the second fail bit activation signal FN2 in response to the second transmission signal TR2.

The third accumulator 431_3 may include a third multiplexer 433_3 and a third accumulating D flip-flop 435_3. The third multiplexer 433_3 may be coupled to an output of the second accumulating D flip-flop 435_2 to receive the second fail bit activation signal FN2 as a first input. An output terminal of the third multiplexer 433_3 may be coupled to an input terminal of the third accumulating D flip-flop 435_3. In addition, an output of the third accumulating D flip-flop 435_3 may be fed back as a second input of the third multiplexer 433_3. The third accumulating D flip-flop 435_3 may be initialized by the initialization signal Init and receive an output of the third multiplexer 433_3 based on a third transmission signal TR3. In addition, based on the fail bit generation signal FB, the third multiplexer 433_3 may select and output one of the second fail bit activation signal FN2 received as the first input and the third fail bit activation signal FN3 fed back as the second input. The third accumulating D flip-flop 435_3 may output the output of the third multiplexer 433_3 as the third fail bit activation signal FN3 in response to the third transmission signal TR3.

The operation of the fail bit counter 400 shown in FIG. 4 will be, schematically described below. The pass/fail data receiver 410 may receive the pass/fail data P/F_DATA. As an example, when a bit fail occurs, the pass/fail data P/F_DATA may have a logic high level "1". When a bit pass occurs, the pass/fail data P/F_DATA may have a logic low level "0". When the pass/fail data P/F has a logic low level, the fail bit generation signal FB of "0" may not be transmitted to the fail bit accumulator 430. However, when the pass/fail data P/F_DATA has a logic high level, the fail bit generation signal FB of "1" may be transmitted to the fail bit accumulator 430.

The first to third accumulating D flip-flops 435_1 to 435_3 included in the first, to third accumulators 431_1 to 431_3 of the fail bit accumulator 430, respectively, may output the first to third fail bit activation signals FN1 to FN3, as an initial value of "0". When a first fail bit is generated and the fail bit generation signal FB of "1" is transmitted to the first accumulator 431_1, the first accumulating D flip-flop 435_1 may output the first fail bit activation signal FN1 of "1" while the second and third accumulating D flip-flops 435_2 and 435_3 output the second and third fail bit activation signals FN2 and FN3 of "0" as the initial value. When a second fail bit is generated and the fail bit generation signal FB of "1" is transmitted to the first accumulator 431_1, the first and second accumulating D flip-flops 435_1 and 435_2 may output the first and second fail bit activation signals FN1 and FN2 of "1" while the third accumulating D flip-flop 435_3 outputs the third fail bit activation signal FN3 of "0" as the initial value. When a third fail bit is generated and the fail bit generation signal FB of "1" is transmitted to the first accumulator 431_1, the first to third accumulating D flip-flops 435_1 to 435_3 may output the first to third fail bit activation signals FN1 to FN3 of "1". Although the fail bit is generated four or more times, the first to third accumulating D flip-flops 435_1 to 435_3 output the first to third fail bit activation signals FN1 to FN3 of "1".

Therefore, when no fail bit is generated, the first to third fail bit: activation signals FN1 to FN3 may have the value of "0". When the fail bit is generated once, the first fail bit activation signal FN1 may have the value of "1" while the second and third fail bit activation signals FN2 and FN3 may have the value of "0". When the fail bit is generated twice, the first and second fail bit activation signals FN1 and FN2 may have the value of "1" while the third fail bit activation signal FN3 may have the value of "0". When the fail bit is generated three times or more, the first to third fail bit activation signals FN1 to FN3 have the value of "1". Accordingly, in the embodiment of FIG. 4 where the number of accumulators is 3, the fail bit counter 400 may count the fail bits to find out whether the number of fail bits is 0, 1, 2 or equal to or greater than 3. The specific operation of the fail bit counter 400 when each signal is applied will be described below with reference to FIG. 5.

Figure 5:
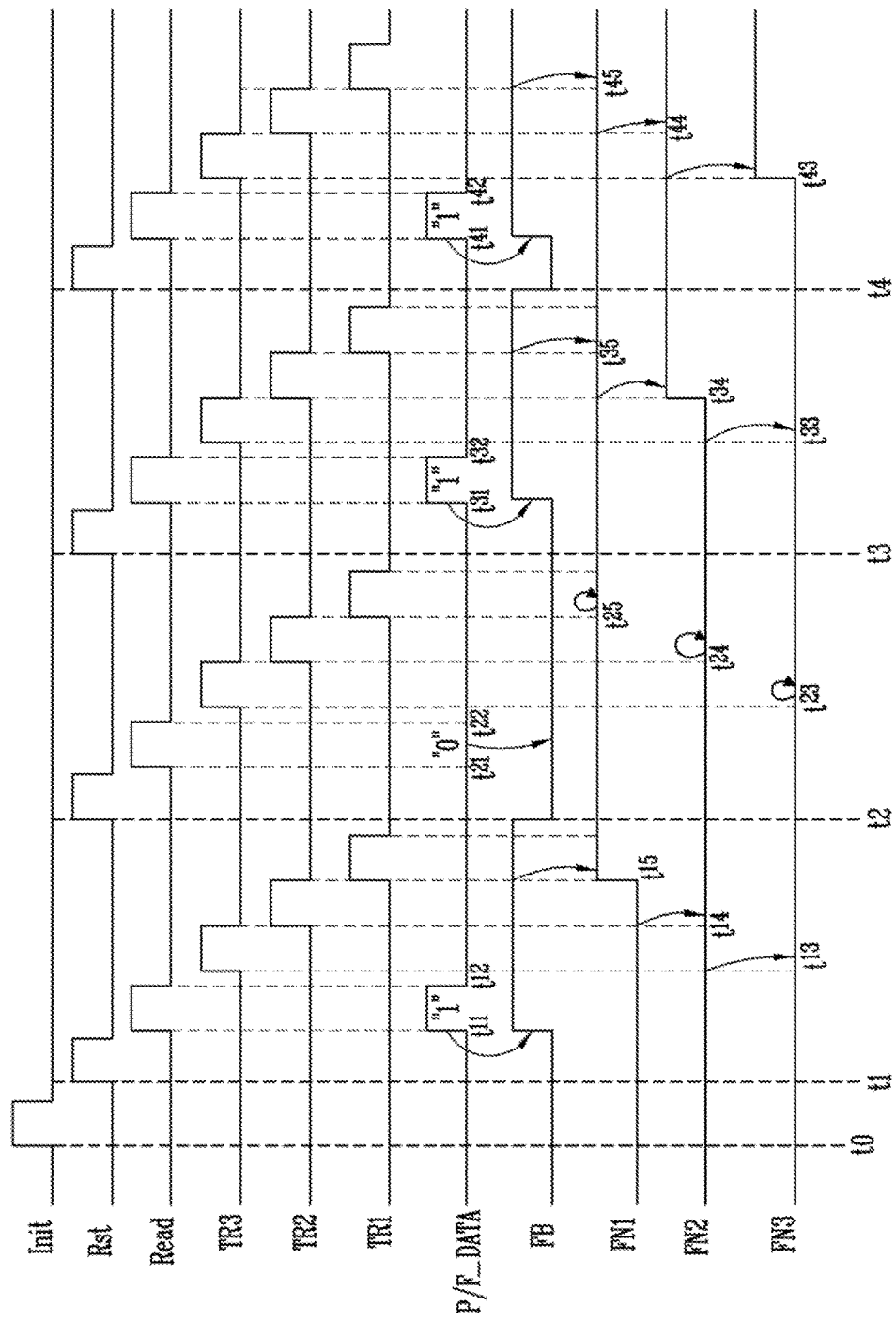
FIG. 5 is a timing diagram illustrating an exemplary operation of the fail bit counter of FIG. 4.

FIG. 5 is a timing diagram illustrating an operation of the fail bit counter of FIG. 4.

Referring to FIG. 5, the initialization signal Init, the reset signal Rst, the read signal Read, the third transmission signal TR3, the second transmission signal TR2, the first transmission signal TR1, the pass/fail data P/F_DATA, the fail bit generation signal FB, the first fail bit activation signal FN1, the second fail bit activation signal FN2 and a third fail bit activation signal FN3 are sequentially illustrated. As shown in FIG. 4, the initialization signal Init may be applied to the first to third accumulating D flip-flops 435_1 to 435_3, and the reset signal Rst and the read signal Read may be applied to the receiving flip-flops 415.

The first to third transmission signals TR1 to TR3 may be applied to the first to third accumulating D flip-flops 435_1 to 435_3, respectively. The pass/fail data P/F_DATA may be applied to the receiving flip-flop 415. In addition, the fail bit generation signal FB may be output from the receiving flip-flop 415 and applied as selection signals of the first to third multiplexers 433_1 to 433_3. The fail bit generation sign& FB may also be applied as the first input of the first multiplexer 433_1. The first fail bit activation signal FN1 may be output from the first accumulating D flip-flop 435_1 and fed back as the second input of the first multiplexer 433_1 and applied as the first input of the second multiplexer 433_2. The second fail bit activation signal FN2 may be output from the second accumulating D flip-flop 435_2, fed back as the second Input of the second multiplexer 433_2, and applied as the first input of the third multiplexer 433_3. The third fail bit activation signal FN3 may be output from the third accumulating D flip-flop 435_3 and fed back as the second input of the third multiplexer 433_3.

At time to, the initialization signal Init may be activated. Accordingly, the first to third fail bit activation signals FN1 to FN3 respectively output from the first to third accumulating D flip-flops 435_1 to 435_3 may be initialized to the initial value of "0".

At time t1, a first pass/fail count period may start. A second pass/fail count period may start at time t2, a third pass/fail count period may start at time t3, and a fourth pass/fail count period may start at time t4. That is, in FIG. 5, the entire four pass/fail count periods are shown. Accordingly, the pass/fail data P/F_DATA may transmit four-bit data to find out whether the four bits pass or fail. Referring to FIG. 5, the pass/fail data P/F_DATA having a value of "1011" is exemplarily applied.

At time t1, the first pass/fail count period may start, and the reset signal Rst may be activated. Thus, the fail bit generation signal FB output from the receiving flip-flop 415 may be initialized to the initial value of "0".

At time $t^{11}$, the activated read signal Read may be applied and the pass/fail data P/F_DATA of "1" may be input, which indicates a fail state. The fail bit generation signal FB, which is output from the receiving flip-flop 415, may transition to "1". The activated read signal Read may be deactivated at time $t^{12}$.

At time $t^{13}$, the third transmission signal TR3 may be activated first. The third multiplexer 433_3 may select and output the second fail bit activation signal FN2 to the input terminal of the third accumulating D flip-flop 435_3, in response to the fail bit generation signal FB of "1". Since the third transmission signal TR3 is activated, the third accumulating D flip-flop 435_3 may output the second fail bit activation signal FN2 as the third fail bit activation signal FN3. However, since the second fail bit activation signal FN2 has the value of "0" at time $t^{13}$, the third fail bit activation signal FN3 may maintain the value of "0".

At time $t^{14}$, the second transmission signal TR2 may be activated. The second multiplexer 433_2 may select and output the first fail bit activation signal FN1 to the input terminal of the second accumulating D flip-flop 435_2, in response to the fail bit generation signal FB of "1". Since the second transmission signal TR2 is activated, the second accumulating D flip-flop 435_2 may output the first fail bit activation signal FN1 as the second fail bit activation signal FN2. However, since the first fail bit activation signal FN1 has the value of "0" at time $t^{14}$, the second fail bit activation signal FN2 may maintain the value of "0".

At time $t^{15}$, the first transmission signal TR1 may be activated. The first multiplexer 433_1 may select and output the fail bit generation signal FB, in response to the first input fail bit generation signal FB of "1". Since the first transmission signal TR1 is activated, the first accumulating D flip-flop 435_1 may output the fail bit generation signal FB as the first fail bit activation signal FN1. Since the fail bit generation signal FB has the value of "1" at time $t^{15}$, the first fail bit activation signal FN1 may transition to the value of "1".

Accordingly, during the first pass/fail count period from the time t1 to the time t2, the first fail bit activation signal FN1, which is output from the first accumulating D flip-flop 435_1 may transition to the value of "1" in response to the generated bit fail, and the second and third fail bit activation signals FN2 and FN3 may maintain the value of "0".

At time t2, the second pass/fail count period may start, and the reset signal Rst may be activated. Thus, the fail bit generation signal FB output from the receiving flip-flop 415 may be initialized to the initial value of "0".

At time $t^{21}$, the activated read signal Read is applied and the pass/fail data P/F_DATA of "0" may be input, which indicates a pass state. The fail bit generation signal FB, which is, output from the receiving flip-flop 415, may maintain the value of "0". The activated read signal Read may be deactivated at time $t^{22}$.

At time $t^{23}$, the third transmission signal TR3 may be activated first. The third multiplexer 433_3 may select the fed-back third fail bit activation signal FN3 to output the third fail bit activation signal FN3 to the input terminal of the third accumulating D flip-flop 435_3, in response to the fail bit generation signal FB of "0". Since the third transmission signal TR3 may be activated, the third accumulating D flip-flop 435_3 may output the third fail bit activation signal FN3 which maintains the value of "0".

At time $t^{24}$, the second transmission signal TR2 may be activated. Similarly to the third multiplexer 433_3, the second multiplexer 433_2 may select and output the fed-back second fail bit activation signal FN2 to the input terminal of the second accumulating D flip-flop 435_2. Accordingly, the second accumulating D flip-flop 435_3 may output the second fail bit activation signal FN2 which maintains the value of "0".

At time $t^{25}$, the first transmission signal TR1 may be activated. Since the fail bit generation signal FB has the value: of "0", the first multiplexer 433_1 may select and output the fed back first fail bit activation signal FN1 to the input terminal of the first: accumulating D flip-flop 435_1. Therefore, the first accumulating D flip-flop 435_1 may output the first fail bit activation signal FN1 which maintains the value of "1".

Accordingly, during the second pass/fail count period from the time t2 to the time t3, the first to third fail bit activation signals FN1 to FN3, which are respectively output from the first to third accumulating D flip-flops 435_1 to 435_3, may maintain previous values thereof in response to the generated bit pass.

At time t3, the third pass/fail count period may start, and the reset signal Rst may be activated. Thus, the fail bit generation signal FB output from the receiving flip-flop 415 may be initialized to the initial value of "0".

At time $t^{31}$, the activated read signal Read may be applied and the received pass/fail data P/F_DATA of "1" may be input, which indicates the fail state. The fail bit generation signal FB, which is output from the receiving flip-flop 415, may transition to the value of "1". The activated read signal Read may be deactivated at time $t^{32}$.

At time $t^{33}$, the third transmission signal TR3 may be activated first. The third multiplexer 433_3 may select and output the second fail bit activation signal FN2 to the input terminal of the third accumulating D flip-flop 435_3, in response to the fail bit generation signal FB of "1". Since the third transmission signal TR3 is activated, the third accumulating D flip-flop 435_3 may output the second fail bit activation signal FN2 as the third fail bit activation signal FN3. However, since the second fail bit activation signal FN2 has the value of "0" at time $t^{33}$, the third fail bit activation signal FN3 may maintain the value of "0".

At time $t^{34}$, the second transmission signal TR2 may be activated. Similarly to the third multiplexer 433_3, the second multiplexer 433_2 may select and output the first fail bit activation signal FN1 to the input terminal of the second accumulating D flip-flop 435_2, in response to the fail bit generation signal FB of "1". Since the second transmission signal TR2 is activated, the second accumulating D flip-flop 435_2 may output the first fail bit activation signal FN1 as the second fail bit activation signal FN2. Since the first fail bit activation signal FN1 has the value of "1" at time $t^{34}$, the second fail bit activation signal FN2 may transition to the value of "1".

At time $t^{35}$, the first transmission signal TR1 may be activated. The first multiplexer 433_1 may select and output the fail bit generation signal FB, in response to the first input fail bit generation signal FB of "1". Since the first transmission signal TR1 is activated, the first accumulating D flip-flop 435_1 may output the fail bit generation signal FB as the first fail bit activation signal FN1. Therefore, the first accumulating D flip-flop 435_1 may output the first fail bit activation signal FN1 which maintains the value of "1".

Accordingly, during the third pass/fail count period from the time t3 to the time t4, in response to the generated bit fail, the first fail bit activation signal FN1 may maintain the value of "1", the second fail bit activation signal FN2 may transition to the value of "1", and the third fail bit activation signal FN3 may maintain the value of "0".

At time t4, the fourth pass/fail count period may start, and the reset signal Rst may be activated. Accordingly, the fail bit generation signal FB output from the receiving flip-flop 415 may be initialized to the initial value of "0".

At time $t^{41}$, the activated read signal Read may be applied, and the input pass/fail data P/F_DATA of "1" may be input, which indicates the fail state. The fail bit generation signal FB, which is output from the receiving flip-flop 415, may transition to the value of "1". The activated read signal Read may be deactivated at time $t^{42}$.

At time $t^{43}$, the third transmission signal TR3 may be activated first. The third multiplexer 433_3 may select and output the second fail bit activation signal FN2 to the input terminal of the third accumulating D flip-flop 435_3, in response to the fail bit generation signal FB of "1". Since the third transmission signal TR3 is activated, the third accumulating D flip-flop 435_3 may output the second fail bit activation signal FN2 as the third fail bit activation signal FN3. Since the second fail bit activation signal FN2 has the value of "1" at time $t^{43}$, the third fail bit activation signal FN3 may transition to the value of "1".

At time $t^{44}$, the second transmission signal TR2 may be activated. Similarly to the third multiplexer 433_3, the second multiplexer 433_2 may select and output the first fail bit activation signal FN1 to the input terminal of the second accumulating D flip-flop 435_2, in response to the fail bit generation signal FB of "1". Since the second transmission signal TR2 is activated, the second accumulating D flip-flop 435_2 may output the first fail bit activation signal FN1 as the second fail bit activation signal FN2. Therefore, the second accumulating D flip-flop 435_2 may output the first fail bit activation signal FN1 which maintains the value of "1".

At time $t^{45}$, the first transmission signal TR1 may be activated. The first multiplexer 433_1 may select and output the fail bit generation signal FB, in response to the first input fail bit generation signal FB of "1". Since the first transmission signal TR1 is activated, the first accumulating D flip-flop $433_{13}$_1 may output the fail bit generation signal FB as the first fail bit activation signal FN1. Therefore, the first accumulating D flip-flop 435_1 may output the first fail bit activation signal FN1 which maintains the value of "1".

Accordingly, during the fourth pass/fail count period, in response to the generated bit fail, the first and second fail bit activation signals FN1 and FN2 may maintain the value of "1", and the third fail bit activation signals may transition to the value of "1".

The operation of the above fail bit counter 400 will be briefly described. The first to third fail bit activation signals FN1 to FN3 of the first to third accumulating D flip-flops 435_1 to 435_3 may be initialized to the initial value of "0", and whenever a fail bit is generated, the value of "1" may be transmitted from the first accumulating D flip-flop 435_1 to the third accumulating D flip-flop 435_3. Therefore at each time point, the number of accumulated fail bits may be detected.

Figure 6:
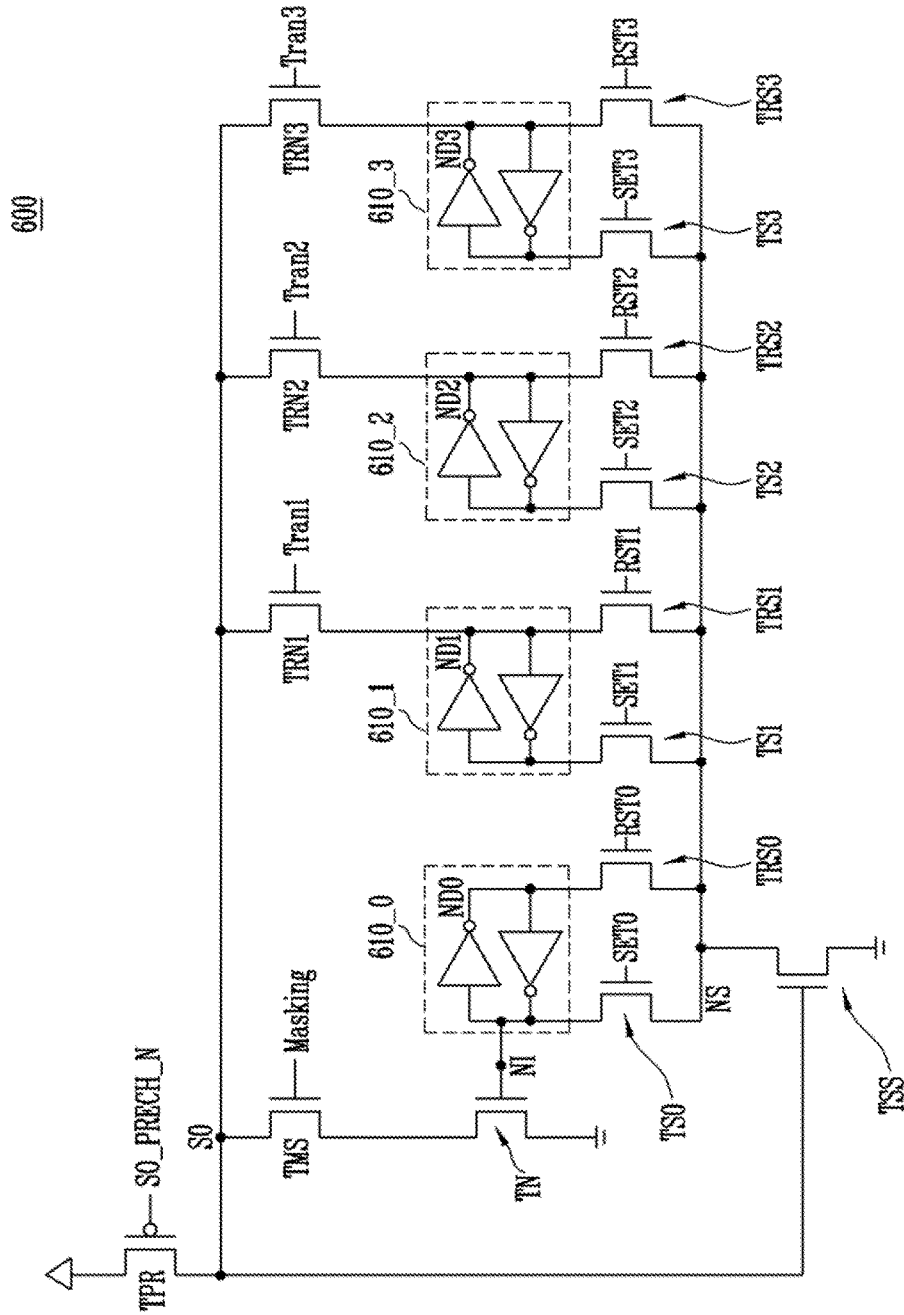
FIG. 6 is a circuit diagram showing another exemplary embodiment of the fail bit counter of FIG. 2.

FIG. 6 is a circuit diagram showing another exemplary embodiment of the fail bit counter of FIG. 2.

Referring to FIG. 6, a fail bit counter 600 may include transistors TPR, TMS, TN, TRAN1, TRAN2, TRAN3, TSS, TS0, TS1, TS2, TS3, TRS0, TRS1, TRS2, and TRS3, and latches 610_0, 610_1, 610_2, and 610_3. The latches 610_0, 610_1, 610_2 and 610_3 may be set by control signals SET0, SET1, SET2 and SET3 and reset by control signals RST0, RST1, RST2 and RST2. The fail bit counter shown in FIG. 6 may cumulatively count the fail bits by "SO-Masking". The pass/fail data P/F_DATA of FIG. 2 may be applied to a node ND0. The fail bit counter 600 shown in FIG. 6 may be integrally embodied with the page buffer coupled to the bit line.

In an embodiment of FIG. 6, the fail bits may be counted by voltages of nodes ND1, ND2, and ND3. Briefly describing the embodiment shown in FIG. 6, when the fail bit is generated, a voltage of the node ND0 may become a logic high level "1", and when the pass bit is generated, the voltage of the node ND0 may become a logic high level "0". When the voltage of the node ND0 become a logic high level "1", voltage value of the node ND may be transmitted to the node ND3, a value of the node ND1 may be transmitted to the node ND2, and a value of the node ND0 may be transmitted to the node ND1. When the voltage of the node ND0 become a logic low level "0", the above voltage transmission may not be generated.

The transmission of the voltage value of the node ND2 to the node ND3 may be performed through the following process. The node ND3 may be initialized to an initial value of "0". The above feature may be performed by turning on the transistor TRS3 through a control signal RST3 and turning on the transistors TPR and TSS through a control signal SO_PRECH_N. In such a state, when the control signal Tran2 applied to a gate of the transistor TRN2 is activated to the value of "1", the voltage value of the node ND2 may be transmitted to a node SO. When the control signal Tran2 is deactivated to the value of "0", the node SO may be floated and maintain the voltage value. Subsequently, when a control signal Masking applied to a gate of the transistor TMS is activated to the value of "1", a value of the node SO may be determined according to the value of the node ND0 in the latch 610_0. In the case where the value of the node ND0 is "0" when the control signal Masking is activated to the value of "1", that is, when the bit pass is generated, a value of a node NI may become "1" and the transistor TN may be turned on so that the node SO may be coupled to the ground. As a result, the voltage of the node SO may become the value of "0", which is referred to as Masking. In the case where the value of the node ND0 is "1" when the control signal Masking is activated to the value of "1", that is, when the bit fail is generated, the value of the node NI may become"0" and the transistor TN may be turned off so that the node SO may maintain the previous value. When a control signal SET3 applied to a gate of a transistor TS3 is activated, the transistor TS3 may be turned on In the case where the node SO is masked, that is, when the bit fail is generated, the voltage of the node SO may become the value of "0". Thus, the transistor TSS may maintain a turn-off state and a node NS may also be floated. Thus, although the transistor TS3 is turned on, the voltage of the node ND3 may not be changed.

In the case where the node SO is not masked, that is, when the bit fail is generated, the node SO may maintain the voltage value received from the node ND2. When the transistor TS3 is turned on under the state that the node ND2 has the value of "0", the node SO may have the value of "0", and the voltage of the node ND3 may remain unchanged to maintain the value of "0". When the transistor TS3 is turned on under the state that the node ND2 has the value of "1", the node SO may have the value of "1" and the transistor TSS may be turned on, so that the transistor TS3 may transmit a ground voltage to the latch 610_3. As a result, the node ND3 may have the value of "1". As described above, after the control signal Tran2 is activated for a predetermined time, the control signal Masking is activated for a predetermined time, and the control signal SETS is activated for a predetermined time, only when the value of the node ND0 is "0", that is, the bit fail is generated, the voltage value of the node ND2 $^{may}$ be transmitted to the node ND3.

In the same manner, after the control signal Tran1 is activated for a predetermined time, the control signal Masking is activated for a predetermined time, and the control signal SET2 is activated for a predetermined time, the voltage value of the node ND1 may be transmitted to the node ND2 only when the value of the node ND0 is "0".

The value of the node ND0 receiving the pass/fail data P/F_DATA may be transmitted to the node ND1 by the following procedure. The node ND1 may be initialized to the initial value of "0" by turning on the transistor TRS1 via the control signal RST1 and turning on the transistors TPR and TSS through the control signal SO_PRECH_N.

When the control signal SO_PRECH_N is set to the value of "0", the node SO may have the value of "1". Subsequently, when the control signal SO_PRECH_N has the value of "1", the node SO may be floated and maintain the value of "1". Thereafter, when the control signal Masking is activated to the value of "1", the value of the node SO may be determined according to the value of the node ND0 in the latch 610_0. In the case where the value of the node ND0 is "0", when the control signal Masking is activated to the value of "1", that is, when the bit pass is generated, the value of the node NI may become "1" and the transistor TN may be turned on, so that the node SO may be coupled to the ground. As a result, the voltage of the node SO may become the value of "0" to be masked. In the case where the value of the node ND0 is "1" when the control signal Masking may be activated to the value of "1", that is, when the bit fail is generated, the value of the node NI may become "0" and the transistor TN may be turned off so that the node SO may maintain the previous value "1". Subsequently, when the control signal SET1 applied to a gate of the transistor TS1 is activated, the transistor TS1 may be turned on.

In case where the node SO may be masked, that is, when the bit pass is generated, the voltage of the node SO may become the value of "0". Thus, the transistor TSS may maintain the turn-off state, and the node NS may be floated. Accordingly, even when the transistor TS1 is turned on, the voltage of the node ND1 may be unchanged and maintain the value of "0".

In the case where the node SO is not masked, that is, when the bit fail is generated, the node SO may maintain the value of "1". As a result, the transistor TSS may be turned on and the transistor TS1 may transmit the ground voltage to the latch 610_1. Accordingly, the node ND1 may have the value of "1". As described above, after the control signal SO_PRECH_N, the control signal Masking, and the control signal SET1 are sequentially activated for respective predetermined times, the voltage value of the node ND1 may transition from "0" to "1" only when the node ND0 has the value of "0", that is, when the bit fail is generated. Therefore, the fail bit counter 600 shown in FIG. 6 may perform substantially the same function as the fail bit counter 400 shown in FIG. 4.

Referring to FIGS. 2 and 6, the pass/fail data receiver 210 shown in FIG. 2 may correspond to the latch 610_0 and the transistors TS0, TRS0, TN, and TMS shown in FIG 6. In the specification the latch 610_0 may be referred to as a "receiving latch", and the transistors TS0 and TRS0 may be referred to as a "receiving set transistor" and a "receiving reset transistor", respectively. Further, the transistor TN may be referred to as the "receiving transistor", and the transistor TMS may be referred to as a "masking transistor". The node NS may be referred to as a "common transmission node" and the node SO may be referred to as an "SO node". Accordingly, in the embodiment of FIG. 6, the pass/fail data receiver 210 may include the receiving latch 610_0 the receiving set transistor TS0 coupled between a first terminal (i.e., the node NI) of the receiving latch 610_0 and the common transmission node NS, the receiving reset transistor TRS0 coupled between a second terminal (i.e., the node ND0) of the receiving latch 610_0 and the common transmission node NS, the receiving transistor TN having a gate coupled to the first terminal of the receiving latch 610_0, and the masking transistor TMS coupled between the receiving transistor TN and the SO node.

In the specification, the fail bit accumulator 230 of FIG. 2 may include first to Nth accumulators 331_1, 331_2, ..., and 331_N as shown in FIG. 3. Referring to FIGS. 3 and 6, the first accumulator 331_1 of FIG. 3 may correspond to the latch 610_1 and the transistors TRN1, TS1, and TRS1 shown in FIG. 6. In the specification, the latch 610_1 may be referred to as a "first accumulating latch", the transistor TRN1 may be referred to as a "first transmitting transistor" and the transistors TS1 and TRS1 may be referred to as a "first set transistor" and a "first reset transistor", respectively. Accordingly, in the embodiment shown in FIG. 6 the first accumulator 331_1 included in the fail bit accumulator 330 may be coupled between the SO node and the common transmission node NS. The first accumulator 331_1 may include the first accumulating latch 610_1, the first set transistor TS1 coupled between a first terminal of the first accumulating latch 610_1 and the common transmission node NS, the first reset transistor TRS1 coupled between a second terminal (i.e., the node ND1) of the first accumulating latch 610_1 and the common transmission node NS and the first transmitting transistor TRN1 coupled between the second terminal of the first accumulating latch and the SO node.

In the same manner, the second accumulator 331_2 of FIG. 3 may correspond to the latch 610_2 and the transistors TRN2, TS2, and TRS2 shown in FIG. 6. Similarly to the first accumulator 331_1 the second accumulator 331_2 may include a "second accumulating latch" 610_2, a "second set transistor" TS2 coupled between a first: terminal of the second accumulating latch 610_2 and the common transmission node NS, a "second reset transistor" TRS2 coupled between a second terminal (i.e., the node ND2) of the second accumulating latch 610_2 and the common transmission node NS, and a "second transmitting transistor" TRN2 coupled between the second terminal of the second accumulating latch 610_2 and the SO node.

The fail bit counter 600 including only three accumulators is illustrated in FIG. 6. However, a person skilled in the art will easily understand that the fail bit counter may include four or more accumulators according to an embodiment.

Figure 7:
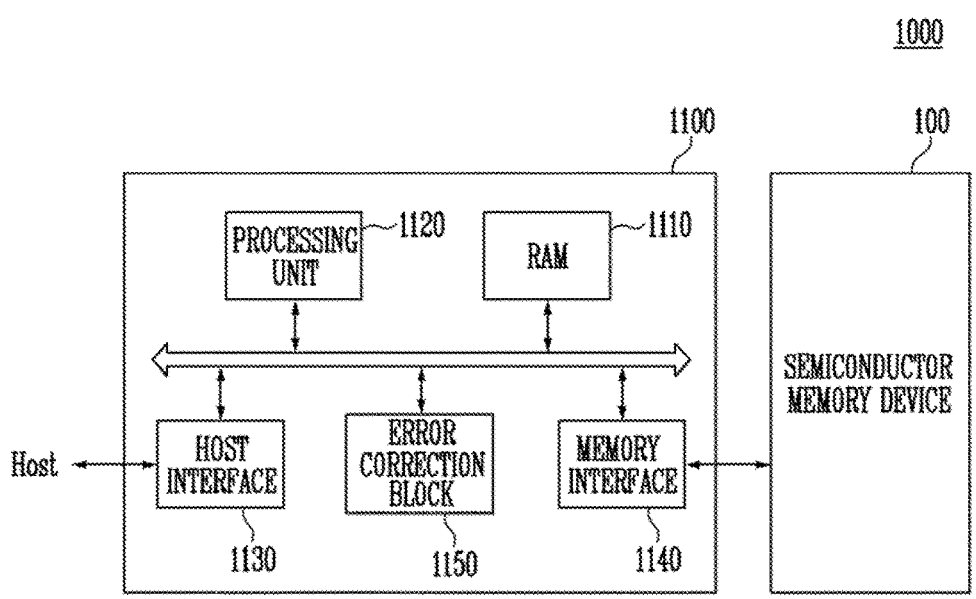
FIG. 7 is a block diagram illustrating a memory system according to an embodiment of the present invention.

FIG. 7 is a block diagram illustrating a memory system 1000 according to an embodiment of the present invention.

Referring to FIG. 7, the memory system 1000 may include a semiconductor memory device 100 and a controller 1100. The semiconductor memory device 100 may have substantially the same structure as the semiconductor memory device 100 described with reference to FIG. 1. Hereinafter, a redundant description will be omitted.

The controller 1100 may be coupled to a host and the semiconductor memory device 100. In response to a request from the host Host, the controller 1100 may be configured to access the semiconductor memory device 100. For example, the controller 1100 may be configured to control read, write, erase, and background operations of the semiconductor memory device 100. The controller 1100 may be configured to provide an interface between the semiconductor memory device 100 and the host. The controller 1100 may be configured to drive firmware for controlling the semiconductor memory device 100.

The controller 1100 may include a random access memory (RAM) 1110, a processing unit 1120, a host interface 1130, a memory interface 1140, and an error correction block 1150. The RAM 1110 may be, used as at least one of an operation memory of the processing unit 1120, a cache memory between the semiconductor memory device 100 and the host and a buffer memory between the semiconductor memory device 100 and the host. The processing unit 1120 may control all operations of the controller 1100. In addition, the controller 1100 may temporarily store, program data provided from the host during the, write operation.

The host interface 1130 may include a protocol for performing data exchange between the host and the controller 1100. As an exemplary embodiment, the controller 1100 may communicate with the host Host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, etc.

The memory interface 1140 may interface with the semiconductor memory device 100. For example, the memory interface 1140 may include a NAND interface or a NOR interface.

The error correction block 1150 may be configured to detect and correct errors of data received from the semiconductor memory device 100 by using an error correcting code (ECC). The processing unit 1120 may control the semiconductor memory device 100 to adjust the read voltage according to an error detection result of the error correction block 1150 and perform a re-read operation. In an exemplary embodiment, the error correction block may be provided as a constituent element of the controller 1100.

The controller 1100 and the semiconductor memory device 100 may be integrated into one semiconductor device. In an exemplary embodiment, the controller 1100 and the semiconductor memory device 100 may be integrated into one semiconductor device to form a memory card. For example, the controller 1100 and the semiconductor memory device 100 may be integrated into one semiconductor device and may be a PC card, which is a personal computer memory card international association (PCM-CIA), a compact flash card (CF), a smart media card (SM and SMC), a memory stick, a multimedia card (MMC, RS-MMC, and MMCmicro), an SD card (SD, miniSD, microSD and SDHC), and a universal flash storage (UFS), and the like.

The controller 1100 and the semiconductor memory device 100 may be integrated into a single semiconductor device to form a solid state drive SSD. The solid state drive SSD may include a storage device configured to store data in a semiconductor memory. When the memory system 1000 is used as the solid state drive SSD, an operation speed of the host Host coupled to a memory system 2000 may be remarkably improved.

In another embodiment, the memory system 1000 may be provided as one of various elements of an electronic device such as a computer, a ultra-mobile PC (UMPC), a workstation, a net-book, a personal digital assistants (PDA), a portable computer, a web tablet, a wireless phone a mobile phone, a smart phone, an e-book, a portable multimedia player (PMP), a game console, a navigation device, a black box, a digital camera, a 3-dimensional television, a digital audio recorder, a digital audio player, a digital picture player, a digital picture recorder, a digital video recorder, a device capable of transmitting/receiving information in an wireless environment, one of various devices for forming a home network, one of various electronic devices for forming a computer network, one of various electronic devices for forming a telematics network, an RFID device, or one of various elements for forming a computing system, or the like.

In an exemplary embodiment, the semiconductor memory device 100 or the memory system 1000 may be embedded in packages if various forms. For example, the semiconductor memory device 100 or the memory system 1000 may be embedded in packages such as a package on package (PoP), bali grid arrays (BGAs), chip scale packages (CSPs), a plastic leaded chip carrier (PLCC), a plastic dual in line package (PDIP), a die in waffle pack, a die in wafer form, a chip on board (COB), a ceramic dual in line package (CERDIP), a plastic metric quad flat pack (MQFP), a thin quad flatpack (TQFP), a small outline (SOIL), a shrink small outline package (SSOP), a thin small outline (TSOP), a thin quad flatpack (TQFP), a system in package (SIP), a multi-chip package (MCP), a wafer-level fabricated package (WFP), a wafer-level processed stack package (WSP) or the like.

Figure 8:
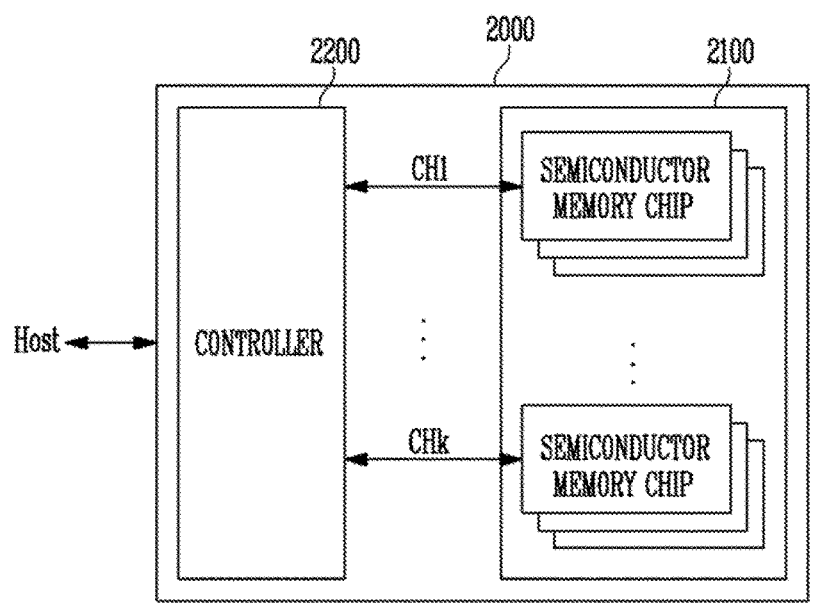
FIG. 8 is a block diagram showing a memory system according to an embodiment of the present invention.

FIG. 8 is a block diagram showing a memory system 2000 according to an embodiment of the present invention.

Referring to FIG. 8, the memory system 2000 may include a semiconductor memory device 2100 and a controller 2200. The semiconductor memory device 2100 may include plurality of semiconductor memory chips. The plurality of semiconductor memory chips may be divided into a plurality of groups.

In FIG, 8, the plurality of groups may communicate with the controller 2200 through first to kth channels CH1 to CHk, respectively. Each semiconductor memory chip may be similarly configured and operate with the semiconductor memory device 100 described with reference to FIG. 1.

Each group may be configured to communicate with the controller 2200 over a single common channel. The controller 2200 may be configured similarly to the controller 1100 described with reference to FIG. 7 and configured to control the plurality of memory chips of the semiconductor memory device 2100 through the plurality of channels CH1 to CHk.

Figure 9:
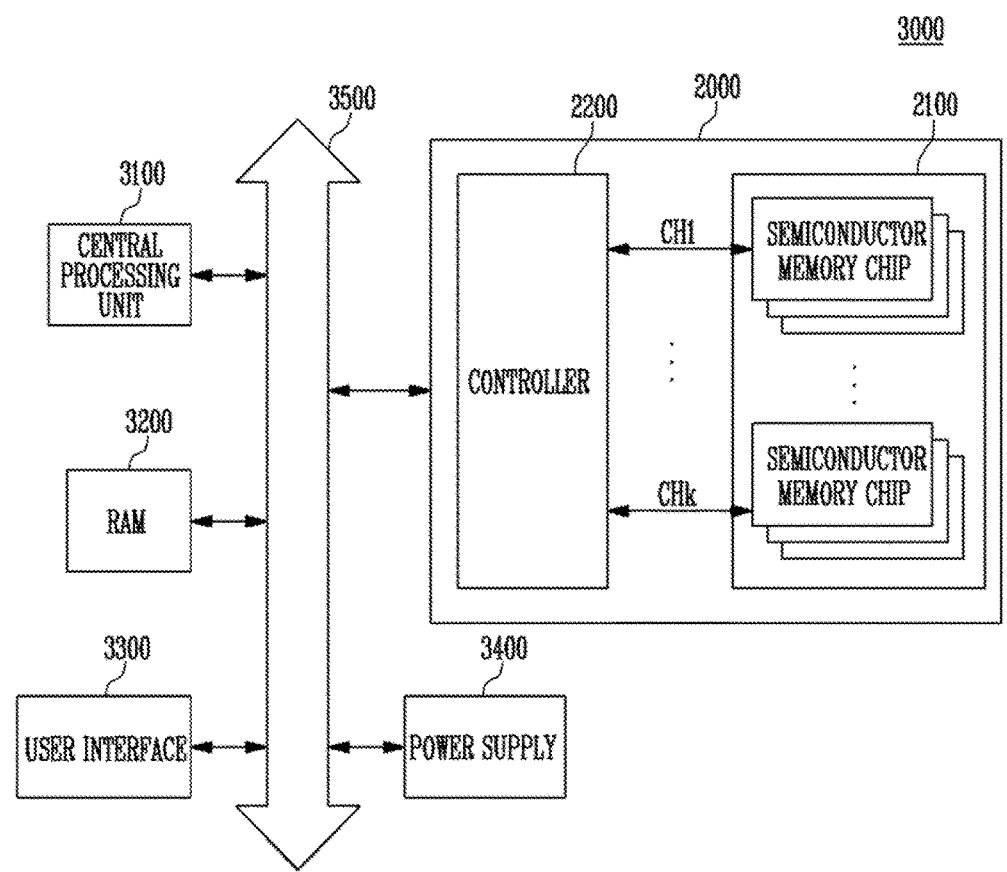
FIG. 9 is a block diagram illustrating a computing system including the memory system of FIG. 8, according to an embodiment of the present invention.

FIG. 9 is a block diagram illustrating a computing system 3000 including the memory system 2000 of FIG. 8, according to an embodiment of the present invention.

Referring to FIG. 9, the computing system 3000 may include a central processing unit 3100, a random access memory (RAM) 3200, a user interface 3300, a power supply 3400, a system bus 3500, and the memory system 2000.

The memory system 2000 may be coupled to the central processing unit 3100, the RAM 3200, the user interface 3300, and the power supply 3400 via the system bus 3500. Data provided via the user interface 3300 or processed by the central processing unit 3100 may be stored in the memory system 2000.

In FIG. 9, the semiconductor memory device 2100 is shown to be coupled to the system bus 3500 through the controller 2200. However, the semiconductor memory device 2100 may be configured to be directly coupled to the system bus 3500. The function of the controller 2200 may be performed by the central processing unit 3100 and the RAM 3200.

In FIG. 9, the memory system 2000 described with reference to FIG. 8 is provided. However, the memory system 2000 may be replaced with the memory system 1000 described with reference to FIG. 7. As an exemplary embodiment, the computing system 3000 may be configured to include all of the memory systems 1000 and 2000 described with reference to FIGS. 7 and 8.

According to an embodiment of the present invention, a fail bit counter for cumulatively counting fail bits may be provided.

According to another embodiment of the present invention, a semiconductor memory device including a fail bit counter for cumulatively counting fail bits is provided.

The embodiments of the present invention disclosed in the present specification and drawings are merely illustrative examples of the present invention in order to facilitate understanding of the present invention and, thus, are not intended to limit the scope of the present invention. It will be apparent to those skilled in the art that other modifications based on the technical idea of the present invention are possible in addition to the embodiments disclosed herein without departing from the scope of the present invention as defined in the appended claims.

What is claimed is:

1. A fail bit counter comprising:
 a pass/fail data receiver configured to receive pass/fail data sequentially and generate a fail bit generation signal based on the pass/fail data, the pass/fail data indicating whether at least one memory cell coupled to a bit line are passed or failed; and
 a fail bit accumulator configured to receive the fail bit generation signal from the pass/fail data receiver, and cumulatively count fail bits based on the fail bit generation signal,
 wherein the pass/fail data receiver comprises:
  a receiving latch temporarily storing the pass/fail data;
  a receiving set transistor coupled between a first terminal of the receiving latch and a common transmission node;
  a receiving reset transistor coupled between a second terminal of the receiving latch and the common transmission node;
  a receiving transistor including a gate coupled to the first terminal of the receiving latch; and
  a masking transistor coupled between the receiving transistor and a sense out (SO) node.

2. The fail bit counter according to claim 1, wherein the fail bit accumulator includes a first accumulator coupled between the SO node and the common transmission node, and
 the pass/fail data is transmitted to the second terminal of the receiving latch.

3. The fail bit counter according to claim 2, wherein the first accumulator comprises:
 a first accumulating latch;
 a first set transistor coupled between a first terminal of the first accumulating latch and the common transmission node;
 a first reset transistor coupled between a second terminal of the first accumulating latch and the common transmission node; and
 a first transmitting transistor coupled between the second terminal of the first accumulating latch and the SO node.

4. The fail bit counter according to claim 2, wherein each of the accumulators comprises:
 an accumulating latch;
 a set transistor coupled between a first terminal of the accumulating latch and the common transmission node;
 a reset transistor coupled between a second terminal of the accumulating latch and the common transmission node; and
 a transmitting transistor coupled between the second terminal of the accumulating latch and the SO node.

5. The fail bit counter according to claim 1, wherein the fail bit accumulator includes a plurality of accumulators coupled between the SO node and the common transmission node, wherein the pass/fail data is transmitted to the second terminal of the receiving latch.

6. A semiconductor memory device comprising:
 a memory cell array including a plurality of memory cells;
 a page buffer coupled to the memory cell array through a bit line; and
 a fail bit counter receiving pass/fail data sequentially indicating whether one of the plurality of memory cells coupled to the bit line is passed or failed through the page buffer, and cumulatively counting fail bits based on the pass/fail data,
 wherein the fail bit counter comprises a pass/fail data receiver comprising:
  a receiving latch temporarily storing the pass/fail data;
  a receiving set transistor coupled between a first terminal of the receiving latch and a common transmission node;
  a receiving reset transistor coupled between a second terminal of the receiving latch and the common transmission node;
  a receiving transistor including a gate coupled to the first terminal of the receiving latch; and
  a masking transistor coupled between the receiving transistor and a sense out (SO) node.

7. The semiconductor memory device according to claim 6, wherein the fail bit counter further comprises:
 a fail bit accumulator outputting a plurality of fail bit activation signals based on the fail bit generation signal.

8. The semiconductor memory device according to claim 7, wherein the fail bit accumulator includes:
 a first accumulator to an Nth accumulator,
 wherein an ith accumulator, among the first to Nth accumulators, outputs an ith fail bit activation signal activated when i or more fail bits are generated based on the fail bit generation signal,
 where N is a natural number greater than 1, and i is a natural number greater than or equal to 1 and smaller than or equal to N.

9. The semiconductor memory device according to claim 8, wherein the first accumulator to the Nth accumulator are coupled between the SO node and the common transmission node, and
 the pass/fail data is transmitted to the second terminal of the receiving latch.

10. The semiconductor memory device according to claim 9, wherein the ith accumulator comprises:
 an ith accumulating latch;
 an ith set transistor coupled between a first terminal of the accumulating latch and the common transmission node;
 an ith reset transistor coupled between a second terminal of the accumulating latch and the common transmission node; and an ith transmitting transistor coupled between the second terminal of the accumulating latch and the SO node.

\* \* \* \* \*